United States Patent
Mahanpour

(10) Patent No.: US 7,093,209 B2
(45) Date of Patent: Aug. 15, 2006

(54) METHOD AND APPARATUS FOR PACKAGING TEST INTEGRATED CIRCUITS

(75) Inventor: Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 365 days.

(21) Appl. No.: 10/663,613

(22) Filed: Sep. 16, 2003

(65) Prior Publication Data
US 2005/0060673 A1    Mar. 17, 2005

(51) Int. Cl.
*G06F 17/50* (2006.01)
(52) U.S. Cl. .............................................. 716/4; 716/5
(58) Field of Classification Search ................ 716/4–6
See application file for complete search history.

(56) References Cited

U.S. PATENT DOCUMENTS

| | | | |
|---|---|---|---|
| 4,920,406 A * | 4/1990 | Watanabe et al. ........... | 257/664 |
| 5,289,117 A * | 2/1994 | Van Loan et al. .......... | 324/761 |
| 6,791,171 B1 * | 9/2004 | Mok et al. ................. | 257/678 |
| 2002/0066063 A1 * | 5/2002 | Saunders et al. .............. | 716/4 |
| 2002/0133794 A1 * | 9/2002 | Kanapathippillai et al. .... | 716/4 |

* cited by examiner

*Primary Examiner*—Vuthe Siek
*Assistant Examiner*—Binh Tat
(74) *Attorney, Agent, or Firm*—Winstead Sechrest & Minick P.C.

(57) ABSTRACT

An system IC is partitioned into test ICs that have a sub-set of the functionality of the system IC. The test ICs have chip I/O pads conforming to a sub-set arrangement of the system IC chip I/O pads. A packaging module is designed to accept means for attaching and fanning-out the system IC chip I/O pads to lower density packaging I/O pads. A test IC is electrically coupled to the packaging module and tested by programming signals and power to the signal and power pads on the module packaging I/O pads corresponding to chip I/O pads for the test IC. Functionality of the system IC may be partitioned into a plurality of test ICs, each with chip I/O pads that conform to an individual sub-set of the system IC I/Os. Two or more of the plurality of test ICs are coupled to the system IC packaging module for testing.

6 Claims, 7 Drawing Sheets

METHOD AND APPARATUS FOR PACKAGING TEST INTEGRATED CIRCUITS

FIELD OF THE INVENTION

The present invention relates to semiconductor devices and in particular to packaging test integrated circuits (system ICs) that have a subset of the circuitry in a corresponding production system IC.

BACKGROUND OF THE INVENTION

Modern processor system IC chips have a large number of circuits which require a corresponding large number of input/output (I/O) pads for coupling signals from the circuits to other system ICs or devices. Because the wiring density on a system IC is much greater than is possible with printed circuit boards (PCBs) used to interconnect system IC devices and other system components, second level packages are required to fan-out the I/Os to a lower density compatible with the wiring capacity of the PCB. Wiring capacity of a PCB is dictated by the number of lines per channel (between vias) and the number of wiring layers. This requires that the pads on the system IC be coupled to the pads on the second level package with some conductive structure (e.g., wires, tape automated bonding (TAB) traces, solder balls, etc.). Modern system ICs also operate with high frequency I/O driver circuits which require the inductance of the conductive structure to be low so that power connections as well as I/O driver connections have minimum transients caused by the fast changing currents that may occur. For this reason, most system ICs with a large number of high performance circuits use small solder balls to connect to the second level package (module) and likewise use an array of solder balls to connect from the module to the PCB. The array of solder balls is termed "ball grid array" (BGA).

During the design phase of a system IC, it is often necessary to have sockets for the BGA modules housing the system IC so that it may be temporarily coupled to various test fixtures for functional, performance, and failure analysis. Therefore, most system IC manufacturers have invested in test fixtures compatible with the various BGA modules that it uses to package the system ICs that it manufactures. These standard BGAs may come with various numbers of I/Os as well as have a variety of configuration patterns for the solder balls themselves.

Since a multiple processor or even a single processor system IC may have millions of transistors and very complex circuitry, it is often desirable to make test ICs that test a subset of the circuitry. These test ICs have fewer transistors, may be smaller, and would naturally have a requirement for fewer I/Os. Since their I/O count is reduced, many times these test ICs are packaged in different modules. Since the test ICs are not going to be used in a product, their I/O structure is designed for convenience. For added flexibility, the I/Os are typically wire bonded to a second level packaging module. This may be simple and flexible, however, the test modules may no longer be compatible with the test fixtures and the programs used to couple signals to the production level modules. Likewise, if wire bonding is used, signal frequencies may be less than is possible with production level circuits. This may reduce the amount of information about the operation of production level circuits that may be acquired from operating the test ICs.

Therefore, there is a need for a method and apparatus that allows test ICs and their second level packaging modules to more nearly match their production counterparts. This will result in test and debug of test ICs under conditions closer to the conditions that will be experienced by production level system ICs to which they correspond. Also production level test fixtures and programs may be employed when operating the test ICs.

SUMMARY OF THE INVENTION

Test chips are designed that contain a subset of the circuitry of a production level system IC. The test ICs also have their chip I/O pads arranged so that they are a subset of the I/O pads of the production level system IC. The test ICs have power pads and signal pads arranged so that they will match corresponding signal and power pads of the second level packaging module used for the production level system IC. Multiple small test ICs, using this method, may be configured to function as a large portion of the production level system IC. These multiple test ICs may be functionally connected together with the production level packaging module and PCB to further facilitate a more complete and accurate test and debug of the production level system IC. Single or multiple test ICs may be designed to be compatible with the pads of the second level package used for the production level system IC. These test ICs may be attached to the production level second level modules to test subsets of the system IC circuitry under a near production level electrical environment. The same test fixtures and test programming may be used to exercise the test ICs. Design changes may be made based on the test results with a high probability that the changes will portray production level performance.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
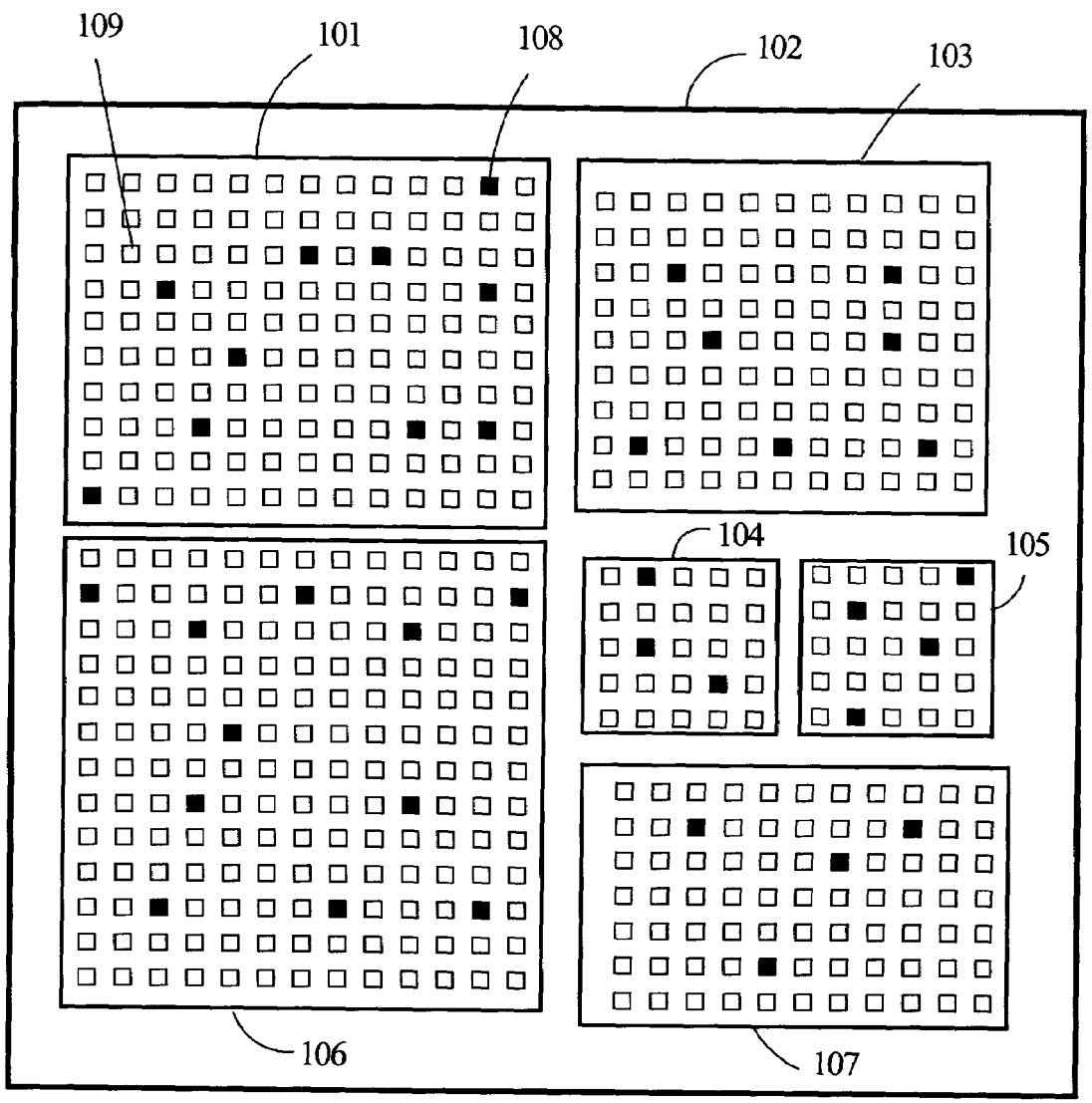
FIG. 1A is a bottom view of the I/O pads on a system IC chip.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1A is bottom view of a system IC 102 illustrating chip I/O pads use to couple system IC 102 a second level package (module not shown) that is used to fan-out the chip I/O pads to a spacing that is compatible with a printed circuit board (PCB not shown) used to interconnect system IC 102 to other system ICs (not shown) and to system functions (not shown). system IC 102 implements various functions (e.g., processing circuitry, storage circuitry, etc.) and these are illustrated as functions 101, and 103–107. The I/O pads are in arbitrarily shown rectangular arrays in the areas corresponding to each function of system IC 102. The I/O pads may be assigned to signals (e.g., pad 109) and to power and ground (e.g., pad 108). The signal pads are illustrated as unfilled squares and the power pads are illustrated as filled in black pads. The configuration of the pads shown here is not significant to the present invention and is only used for illustration. For a system IC with high I/O pad density, controlled collapse circuit connect (C4) solder balls are used in place of bonding wires. C4 solder balls are a high performance way of connecting a chip to a module using an array connection. C4 provides the best electrical performance and the most direct connection of a system IC to a module.

Figure 1B:
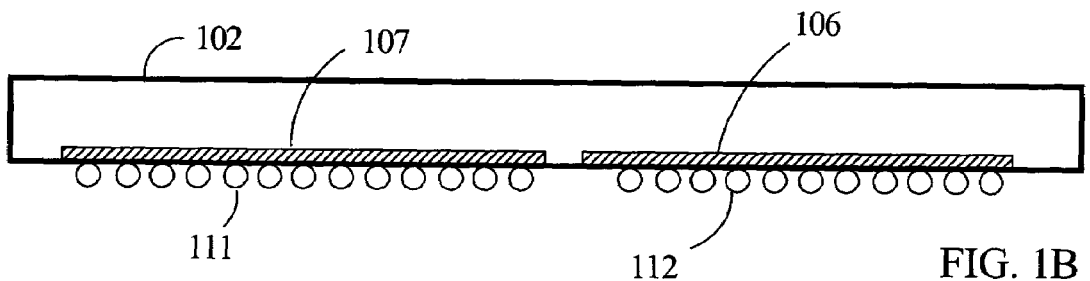
FIG. 1B is an edge view of the system IC of FIG. 1A illustrating the C4 solder balls.

FIG. 1B is a side view of system IC 102 of FIG. 1A showing functional areas 106 and 107 with C4 solder balls (e.g., exemplary solder balls 111 and 112) attached to the I/O pads of system IC 102.

Figure 2:
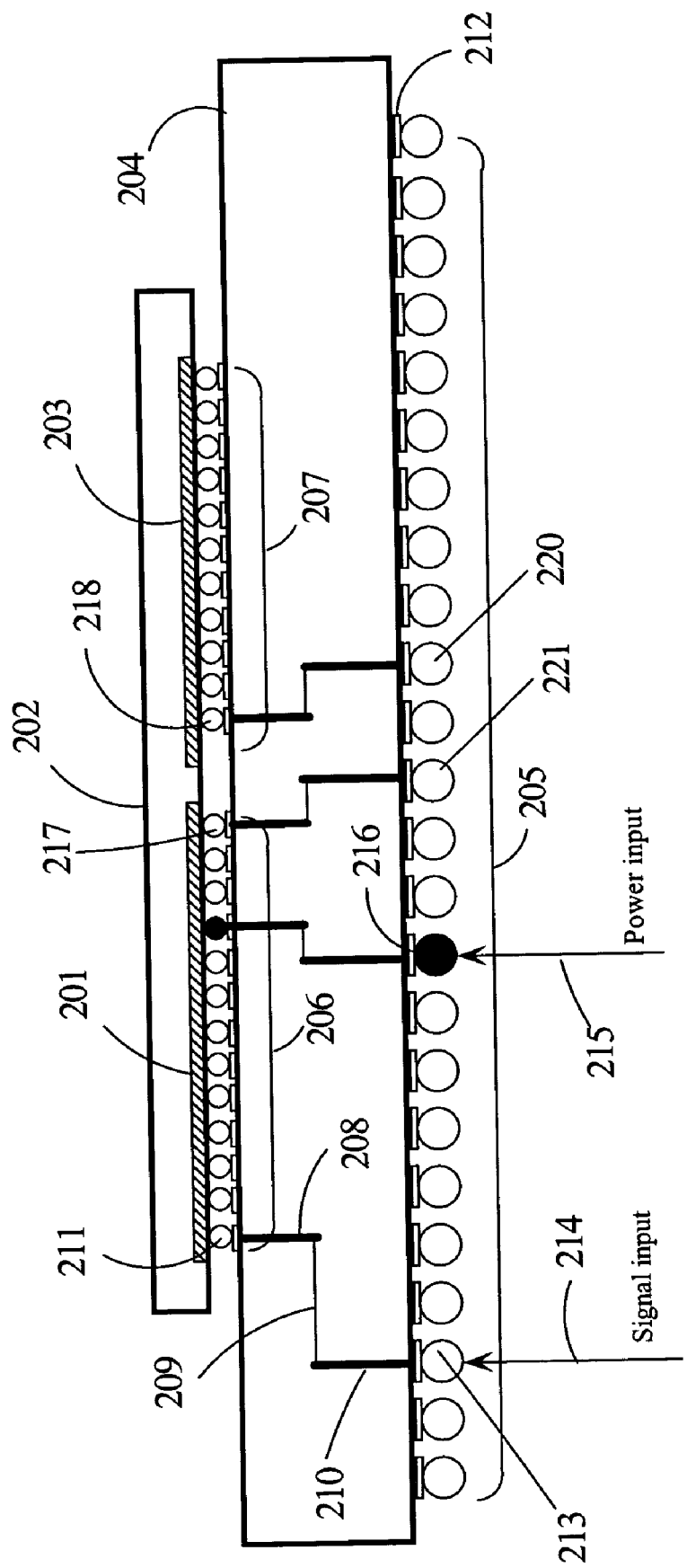
FIG. 2 is a side view of a system IC attached to a second level package module.

FIG. 2 is a side view of a system IC 202 attached to a module 204 using C4 solder balls 206 and 207. Exemplary functional circuit areas 201 and 203 are also shown in this side view. The pads for attaching the C4 solder balls are coupled to corresponding pads (e.g., module pad 212) for attaching the larger solder balls of the module BGA 205. For example, the pad for C4 211 is coupled to module pad for BGA solder ball 213. Conductive via 208 couples C4 211 to a wiring layer in module 204 illustrated by printed circuit wire (PCW) 209. PCW 209, in turn, couples to conductive via 210 which couples to BGA solder ball 213. In this manner, the high density C4 patterns 206 and 207 are fanned out to a less dense BGA pattern 205. Module 204 is either designed specifically for system IC 202 or it has a standard pattern of signal and power I/O BGA solder balls and corresponding C4 attachment patterns. If module 204 is a standard design, it may be made in high volume for a variety of system ICs that are designed to be compatible with the number an arrangement of the signal and power C4 attachment pads on system ICs. All the connections from C4 patterns 206 and 207 to BGA pattern 205 are not shown to simplify FIG. 2. A signal 214 is shown coupled to BGA solder ball 213. A power input (voltage or ground) 215 is shown coupled to an exemplary power BGA solder ball 216. A signal I/O (C4 217) from functional circuits 201 is shown coupled to BGA solder ball 221, and a signal I/O (C4 218) from functional circuits 203 is shown coupled to BGA solder ball 220. An exemplary BGA solder ball pad 212 for packaging module 204 is also shown.

Figure 3:
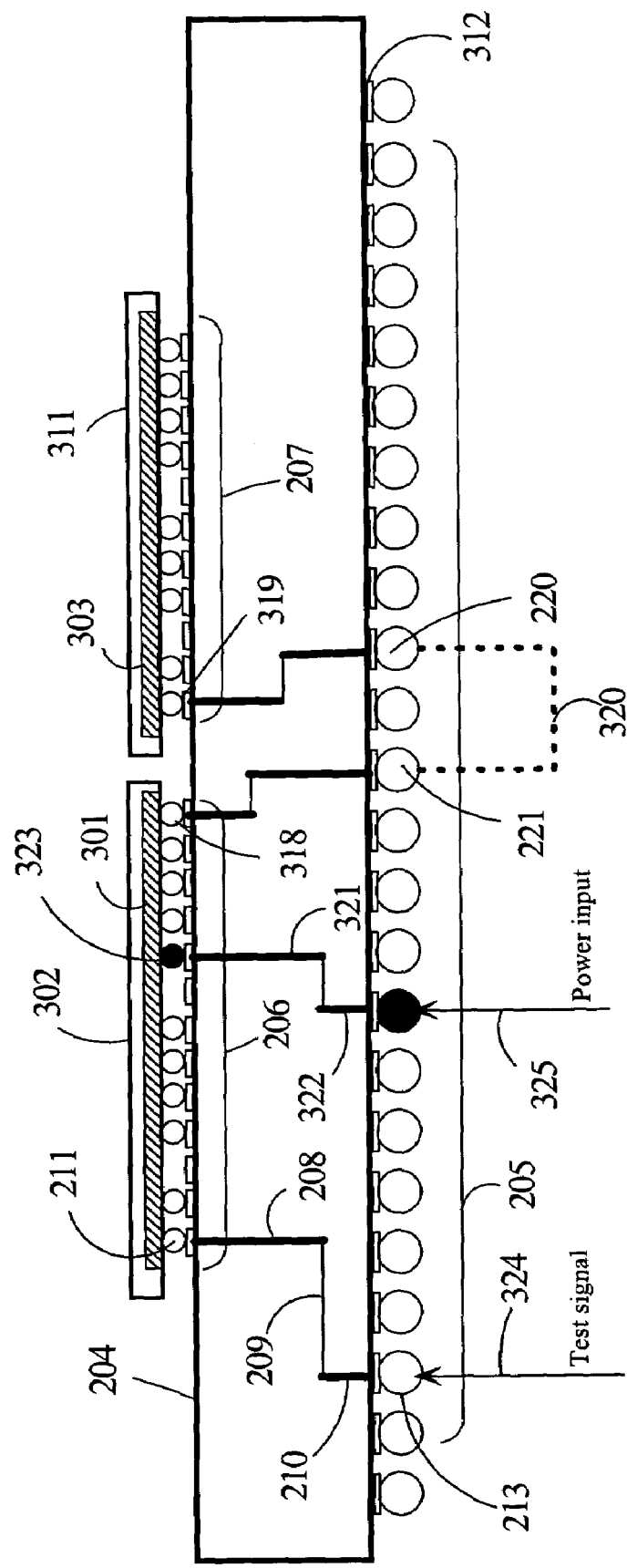
FIG. 3 is a side view of a second level packaging module with two test ICs according to embodiments of the present invention.

FIG. 3 illustrates test ICs 302 and 311 designed to incorporate all or some of the functions of functional circuits 201 and 203 of system IC 202 in FIG. 2. In this embodiment, both test ICs 302 and 311 are attached to module 204 using a subset of the C4 I/O pads within C4 pad patterns 206 and 207 respectively. Test IC 302, which is designed to test the functionality of circuitry within function 201, may implement all or part of the functionality of function 201. Therefore, a particular test IC 302 may use all or part of the C4 pads within C4 pattern 206. While signal I/Os of test ICs 302 or 311 are designed to attach to corresponding signal pads in C4 pad patterns 206 and 207, they may not connect to all the same pads as the corresponding function on system IC 202. For example, in some applications it may be desirable to provide the option to connect a signal in test IC 302 (e.g., C4 pad 318) to a signal (e.g., C4 319) in test IC 311. C4 318 may be coupled to BGA ball 221 and a PCB (not shown) may use a PCW 320 to connect to BGA ball 220. BGA ball 220 may then be coupled back to C4 319 using wiring in module 204. Using this methodology, module 204 and a PCB may be used to connect a variety of signals and make a variety of interconnections between two or more test ICs (e.g., 302 and 311) used to implement circuitry of a production system IC 202. Using the embodiment of FIG. 2, system IC 202 may be partitioned into a number of smaller test ICs (e.g., 302 and 311) that incorporate all the functionality of system IC 202. These test ICs may be attached to module 204 and their corresponding C4 I/O pads wired to BGA pads. A PCB may then be designed to connect the test ICs back together forming the functionality of system IC 202. While this arrangement may not be able to be operated at the same frequency as system IC 202 attached to module 204, it may allow the test circuitry to emulate the functionality of system IC 202. When problems are found, the smaller test ICs may be redesigned until the functionality of system IC 202 is completely tested. Then, when the final system IC 202 design is implemented as a full size system IC 202, the same module and test set-up may be used to test IC 202 at its operating limits.

Since test IC 302 may not be exactly the same as the functional circuits 201 from FIG. 2, the same wiring in module 204 may couple a different test signal to the same physical C4 solder ball 211. For example, test signal 324 may be coupled to BGA solder ball 213. Via 210 and circuit line 209 are coupled to C4 solder ball 211 with via 208. These may be the same physical vias on module 204 but they may couple a different signal to a function in test chip 302 that was designed to fit a subset of the C4 pad pattern on module 204. Power input 325 may couple to C4 solder ball 323 with vias 322 and 321.

Figure 4:
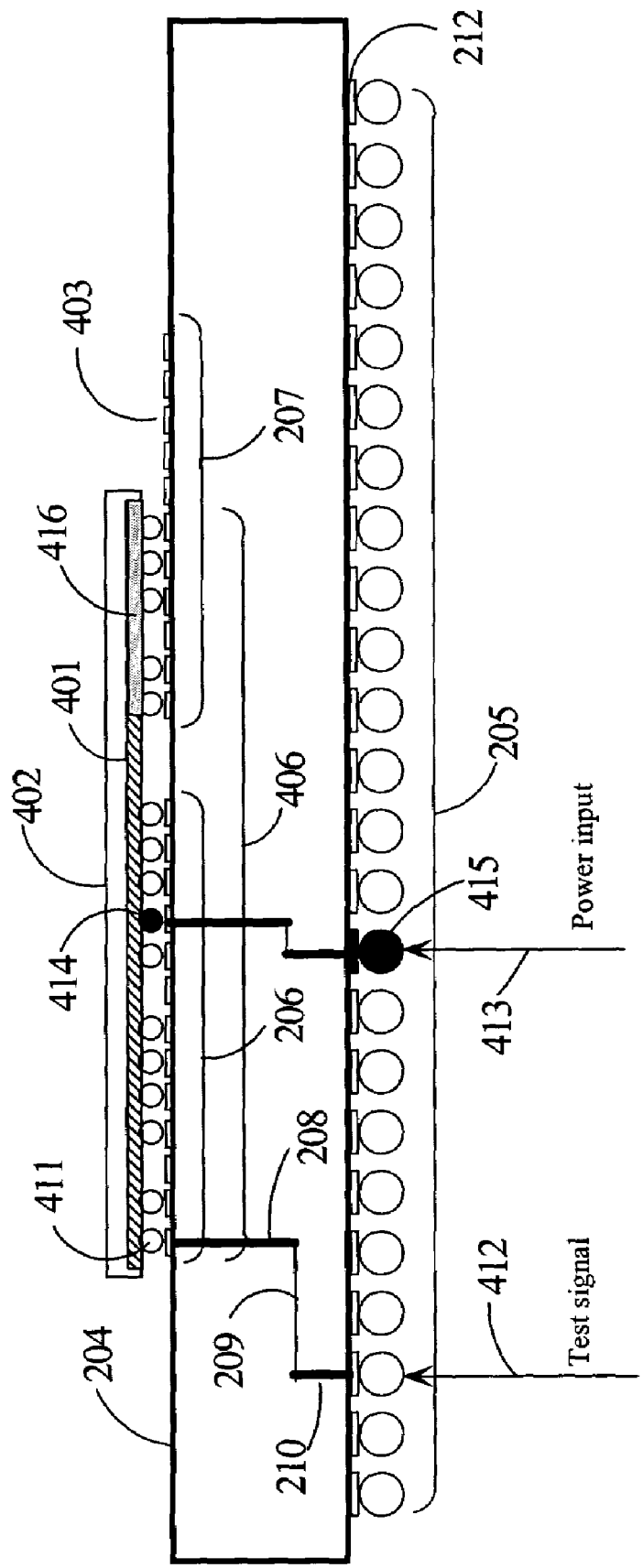
FIG. 4 is a side view of a module with one test IC using a sub-set of a system IC's I/O pads.

FIG. 4 illustrates another embodiment of the present invention. In this embodiment, module 204 is used to couple a test IC 402 that is larger and has I/Os that extend across the subset 406 of the C4 patterns 206 and 207. The functions 401 and 416 may be part of system IC 202 from FIG. 2. Any high wiring density connections between functions 401 and 416 would be contained on test IC 402. Any external I/O connections needed to test these functions would be provided by way of subsets of C4 pads 206 and 207 on module 204. Again, a test signal 412 may be coupled to C4 solder ball 411 coupled to function 401 using the same vias 208 and 210 and module circuit line 209. Power input 413 is coupled to BGA solder ball 415 and couples to power C4 solder ball 414.

Unused C4 pads 403 are outside of the area of test IC 402. As long as test IC 402 has signal and power I/Os that fall within the number and pattern of C4 pads on module 204, module 204 may be used to package test IC 401. A tester (not shown) that is programmable to selectively connect signals to BGA balls 205 may be used to exercise test IC 402 using module 204. Module 204 may have a standard mating socket (not shown) which further reduces the cost of packaging test ICs and providing test fixtures.

Figure 5:
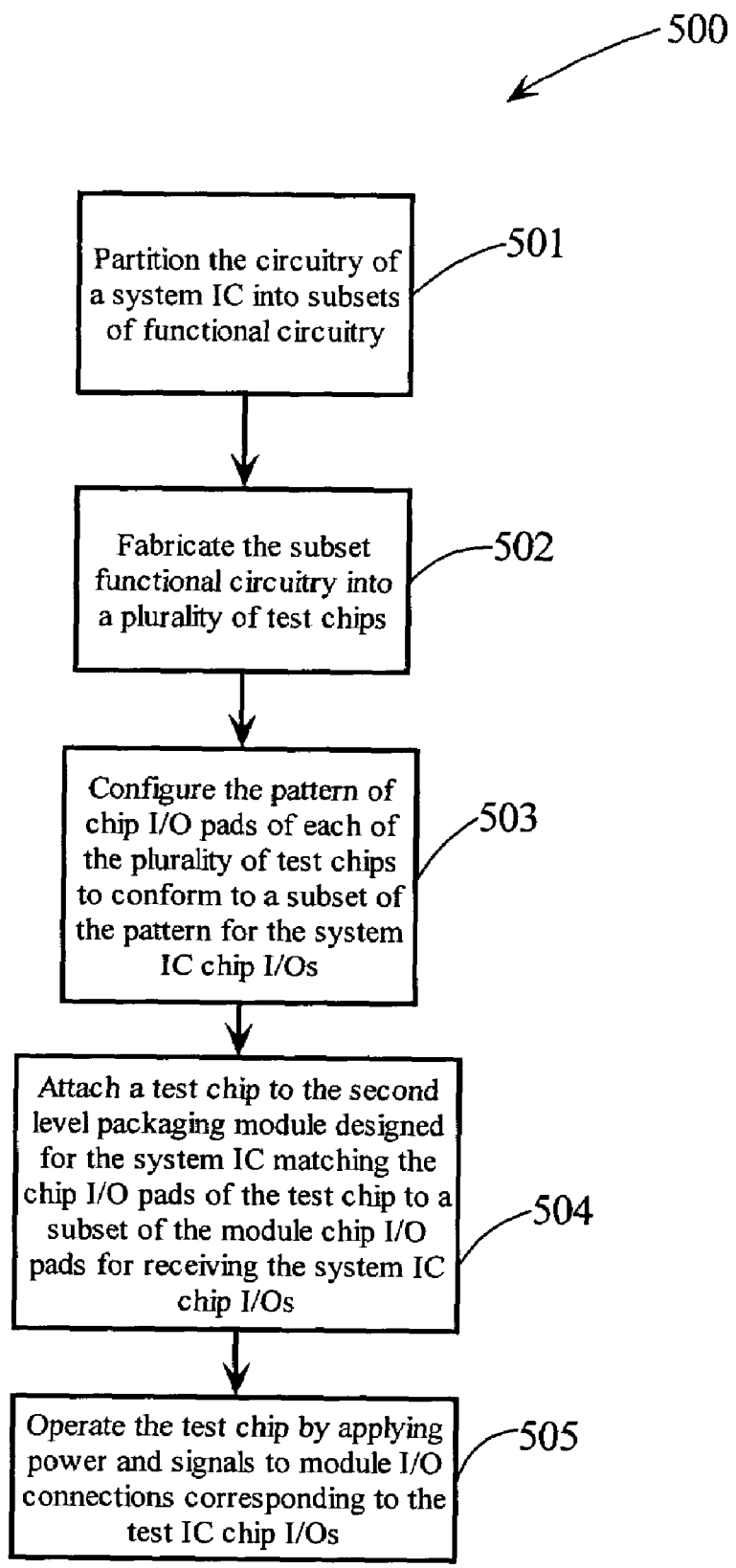
FIG. 5 is a flow diagram of method steps used in embodiments of the present invention.

FIG. 5 is a flow diagram 500 of method steps used in embodiments of the present invention. In step 501, the circuitry of a system IC is partitioned into subsets of functional circuitry. The subsets of functional circuitry primarily require only I/Os coupled to the system IC chip I/O pads. In step 502, the subset of functional circuitry is fabricated into a plurality of test ICs. In step 503, the pattern of the chip I/O pads of each of the plurality of test ICs is configured to conform to a subset of the pattern for the system IC chip I/Os. In step 504, a test IC is attached to a second level packaging module designed for the system IC, matching the chip I/O pads of the test IC to a subset of the module I/O pads for the system IC chip I/Os. In step 505, this test IC is operated by applying power and signals to module I/O connections corresponding to the test IC chip I/O pads.

Figure 6:
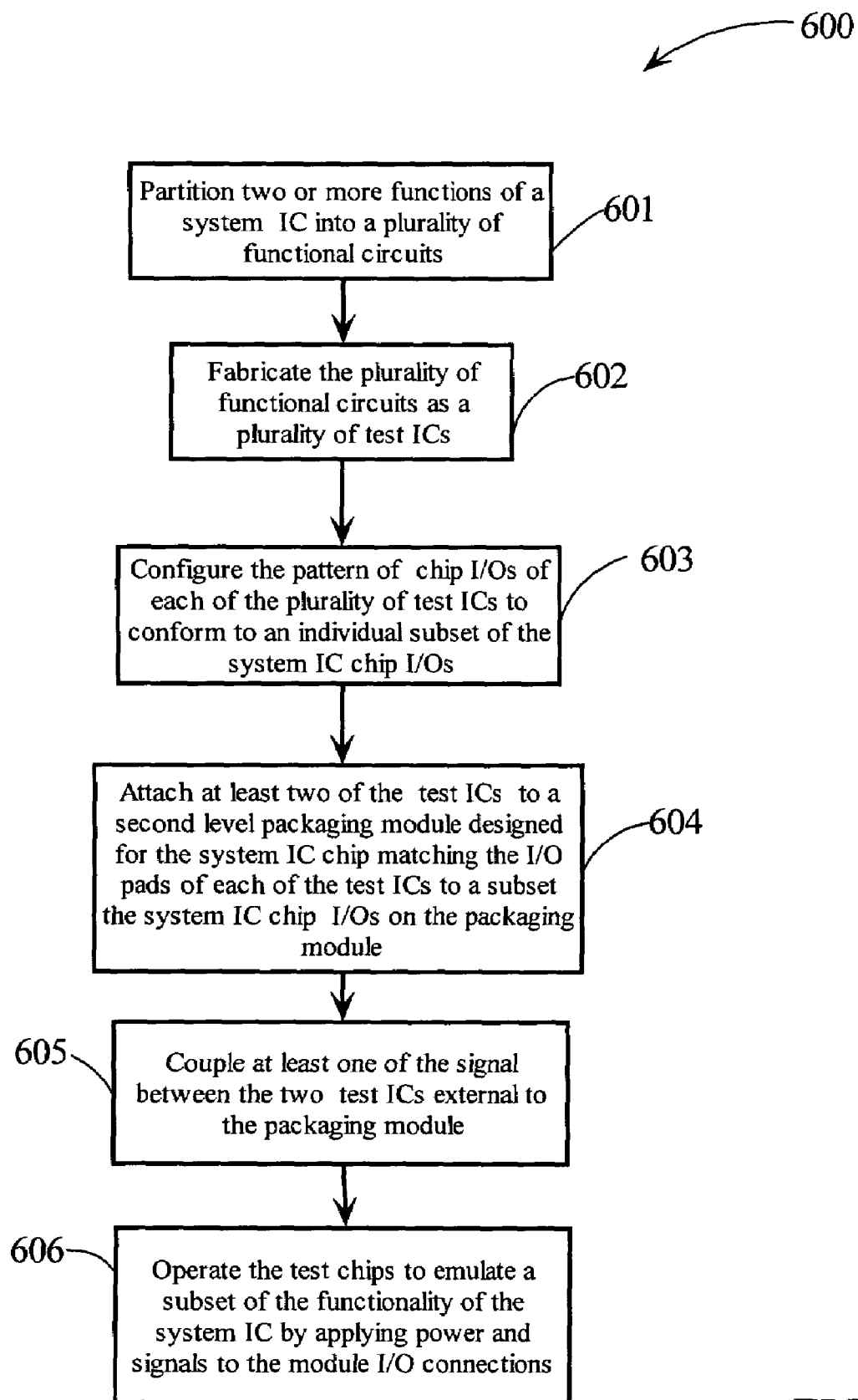
FIG. 6 is another flow diagram of method steps used in embodiments of the present invention.

FIG. 6 is a flow diagram 600 of method steps used in embodiments of the present invention. In step 601, two or more functions of a system IC are partitioned into a plurality of functional circuits that primarily receive off-chip communication. In step 602, the functional circuits are configured as a plurality of test ICs. In step 603, the pattern of I/O pads of each of the plurality of test ICs are configured to conform to at individual subsets of the system IC chip I/Os. In step 604, at least two of test ICs are attached to a second level packaging module design for the system IC, matching the I/O pads of the test ICs to a corresponding subset of chip I/O pads on the packaging module. In step 605, at least one signal between the plurality of test ICs is coupled external to the packaging module. In step 606, the plurality of test ICs are operated to emulate a subset of the functionality of the system IC by applying power and signals to module I/O connections corresponding to the system IC chip, and coupling at least one signal between test ICs external to the packaging module.

Figure 7:
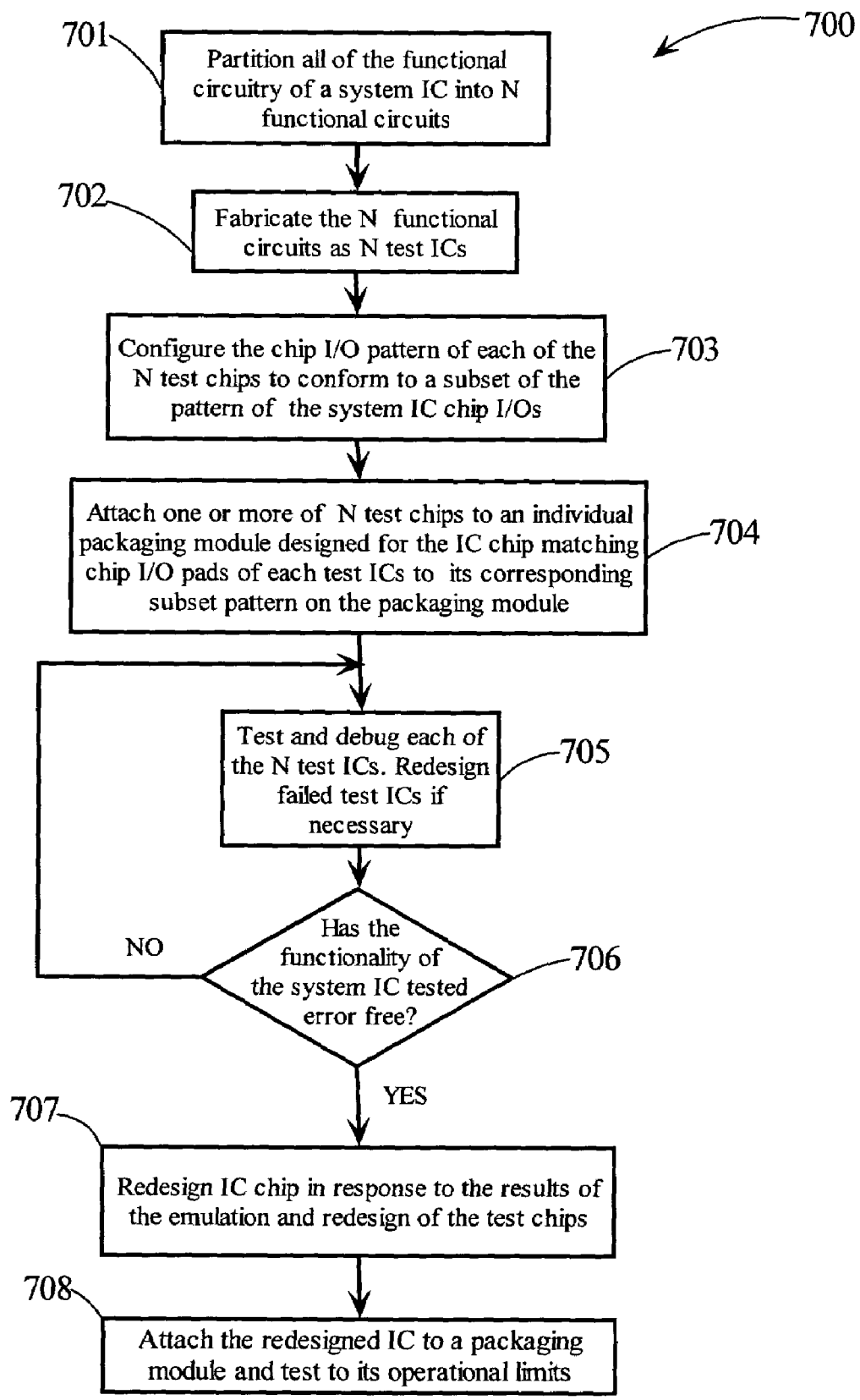
FIG. 7 is yet another flow diagram of method steps used in embodiments of the present invention.

FIG. 7 illustrates a flow diagram 700 of method steps used in one embodiment of the present invention. In step 701, all the functional circuitry of a system IC is partitioned into N functional circuits. In step 702, the N functional circuits are fabricated as N test ICs. In step 703, the chip I/O pads of each of the N test ICs are configured to conform to a corresponding subset of the pattern of the system IC chip I/Os. In step 704, one or more of the N test ICs are attached to one or more individual packaging modules designed for the system IC, matching the I/O pads of each of the test ICs to its corresponding pattern on the packaging module. In step 705, the N test ICs are tested and debugged by coupling signals and power to packaging I/Os of the packaging modules and failed chips are redesigned if necessary. In step 706, a test is done to determine if all the functionality of the system IC has tested error free. If the result of the test in step 706 is NO, then step 705 is repeated. If the result of the test is YES, then in step 707, the system IC is redesigned based on results from the debug and redesign of the N test ICs. In step 708, the redesigned system IC is attached to the packaging module and tested at its operation limits.

Although the present invention and its advantages have been described in detail, it should be understood that various changes, substitutions and alterations can be made herein without departing from the spirit and scope of the invention as defined by the appended claims.

What is claimed is:

1. A method for testing the design of an integrated circuit (system IC) comprising the steps of:
   (a) designing the system IC to have a predetermined number and pattern for its chip I/O pads;
   (b) designing a packaging module to fan-out the I/O of the system IC to an expanded pitch of packaging I/O pads having a correspondence to said chip I/O pads;
   (c) partitioning circuitry of said system IC into a functional circuit;
   (d) designing said functional circuit as a corresponding test IC, wherein said test IC I/O pads conform to one of a sub-set of the number and pattern of said chip I/O pads;
   (e) attaching said test IC to said packaging module with conductive material;
   (f) exercising said test IC by applying signals and power to inputs of said packaging module at packaging I/O pads corresponding to said sub-set of chip I/O pads; and
   (g) collecting test data corresponding to said test IC.

2. A method for testing the design of an integrated circuit (system IC) comprising the steps of:
   (a) designing said system IC to have a predetermined number and pattern for its chip I/O pads;
   (b) designing a packaging module to fan-out the chip I/O to an expanded pitch of packaging I/O pads having a correspondence to said chip I/O pads;
   (c) partitioning functionality of said system IC into a plurality of individual functional circuits;
   (d) designing said plurality of individual functional circuits as a corresponding plurality of test ICs, wherein each of the test ICs conforms to one of a plurality of sub-sets of chip I/O pads making up said number and pattern of said chip I/O pads;
   (e) attaching said plurality of test ICs to said packaging module with conductive material;
   (f) interconnecting an I/O of a first test IC of said plurality of test ICs to an I/O of a second test IC of said plurality of test ICs external to said packaging module;
   (g) operating said plurality of test ICs by applying signals and power to selected ones of said packaging I/O pads corresponding to said plurality of sub-sets of said number and pattern of said chip I/O pads; and
   (h) collecting test data corresponding to operating said plurality of test ICs.

3. The method of claim 2 further comprising the steps of:
   redesigning a first test IC of said plurality of test ICs generating a redesigned first test IC in response to said test data;
   replacing a corresponding one of said plurality of tests chips with said redesigned first test IC; and
   repeating steps (e)–(g).

4. The method of claim 2 further comprising the step of:
   redesigning said functionality of said system IC in response to said test data.

5. The method of claim 2 further comprising the steps of:
   coupling said system IC onto a PCB for a system designed to use said system IC; and
   operating said system IC to emulate at least one function of said system.

6. The method of claim 2 further comprising the step of:
   testing said system IC in a test fixture designed for said system IC.

* * * * *